(12) United States Patent
McKinnon et al.

(10) Patent No.: US 6,570,383 B1
(45) Date of Patent: May 27, 2003

(54) METHOD AND APPARATUS FOR A PULSE SEQUENCE FOR MAGNETIC RESONANCE IMAGING IN AN INHOMOGENEOUS MAGNETIC FIELD

(75) Inventors: Graeme C. McKinnon, Hartland, WI (US); Jean H. Brittain, Pewaukee, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/748,928

(22) Filed: Dec. 27, 2000

(51) Int. Cl.$^7$ .................................................. G01V 3/00
(52) U.S. Cl. ....................... 324/314; 324/307; 324/309; 324/312
(58) Field of Search ................................ 324/314, 307, 324/309, 320, 312

(56) References Cited

U.S. PATENT DOCUMENTS

| | | | | |
|---|---|---|---|---|
| 4,703,267 A | * | 10/1987 | Maudsley | 324/307 |
| 5,023,554 A | | 6/1991 | Cho et al. | 324/309 |
| 5,142,231 A | * | 8/1992 | Jensen et al. | 324/307 |
| 5,309,101 A | * | 5/1994 | Kim et al. | 324/309 |
| 5,341,099 A | * | 8/1994 | Suzuki | 324/307 |
| 5,677,630 A | | 10/1997 | Laskaris et al. | 324/320 |
| 5,739,688 A | * | 4/1998 | Krieg | 324/307 |
| 5,798,643 A | * | 8/1998 | Werthner | 324/309 |
| 6,002,255 A | | 12/1999 | Pulyer | 324/320 |
| 6,252,401 B1 | * | 6/2001 | Werthner et al. | 324/307 |
| 6,275,038 B1 | * | 8/2001 | Harvey | 324/307 |
| 6,294,972 B1 | * | 9/2001 | Jesmanowicz et al. | 324/318 |
| 6,320,378 B1 | * | 11/2001 | Maier et al. | 324/307 |

OTHER PUBLICATIONS

Stewart C. Bushong, Magnetic Resnance Imaging Physical and Biological Principles 1996; Mosby, second edition, pp. 66–69, 257–278 and 474.*

Richard Ehman; Glossary of MR Terms 1995; ACR; fourth edition, p. 7.*

Morgan et al., "A Readout Magnet for Prepolarized MRI,", MRM, vol. 36, pp. 527–536, 1996, Williams & Wilkins.

Hennig et al., "RARE Imaging: A Fast Imaging Method for Clinical MR," Magnetic Resonance in Medicine, vol. 3, No. 6, pp. 823–833, 1986, Academic Press, Inc.

Melki et al., "Comparing the FAISE Method with Conventional Dual–Echo Sequences," Journal of Magnetic Resonance Imaging, vol. 1, No. 3, pp. 319–326, May/Jun. 1991, Society for Magnetic Resonance Imaging.

* cited by examiner

Primary Examiner—Edward Lefkowitz
Assistant Examiner—Dixomara Vargas
(74) Attorney, Agent, or Firm—Carl B. Horton

(57) ABSTRACT

A method and system for imaging using an inhomogeneous static magnetic field is disclosed herein. The imaging includes providing the inhomogeneous static magnetic field to an object of interest located within an imaging volume. The imaging further includes providing a pulse sequence including a readout gradient pulse and a slice selection gradient pulse, both gradient pulses comprising a part of the inhomogeneous static magnetic field. The pulse sequence is configured to acquire a plurality of lines of k-space data per excitation.

19 Claims, 2 Drawing Sheets

METHOD AND APPARATUS FOR A PULSE SEQUENCE FOR MAGNETIC RESONANCE IMAGING IN AN INHOMOGENEOUS MAGNETIC FIELD

BACKGROUND OF THE INVENTION

The present invention relates generally to magnetic resonance (MR) imaging. More particularly, the present invention relates to a pulse sequence for an MR imaging system in an inhomogeneous magnetic field.

The magnetic resonance (MR) phenomena involves providing a fairly strong static magnetic field (polarizing field $B_0$, along the z-direction in a Cartesian coordinate system denoted as x, y, and z) throughout an image volume of the subject or area of interest (e.g., one or more anatomy of a patient being studied). Of the molecules comprising the subject or area of interest within the image volume, those nuclei having magnetic moments (i.e., those having an odd number of protons) attempt to align themselves with this static magnetic field. Such orientated nuclei, i.e., in a quiescent orientation, can be nutated (by controlled amounts) when a radio frequency (RF) pulse (excitation field $B_1$), which is in the x-y plane and which is tuned to the Larmor frequency, is applied in its vicinity. The presence of the RF pulse causes a net aligned moment, $M_z$, of the orientated nuclei to be rotated or "flipped" at a certain flip angle into the x-y plane, to produce a net traverse magnetic moment, $M_t$. Once the RF pulse is terminated, the nutated or excited nuclei eventually return to their quiescent orientation and in the process emit certain RF signals, which can be detected and processed to form an MR image.

When utilizing these signals to produce MR images, linear magnetic field gradient pulses ($g_x$, $g_y$, and $g_z$) along three mutually orthogonal axes are also applied in a predetermined sequence to spatially encode the RF MR signals, so as to produce a map or "image" of the different nuclei populations (i.e., the various tissues) within a given image volume. Typically, the object to be imaged is scanned by a sequence of measurement cycles, in which the linear gradient pulses and the RF pulses are selectively superimposed on the static magnetic field in accordance with the particular localization method being used. The resulting set of received MR signals, also referred to as nuclear magnetic resonance (NMR) signals, are digitized and processed to reconstruct data representative of the volume of spatially encoded and nutated nuclei into an MR image, using one of many well-known reconstruction techniques.

Usually, extreme care is taken to ensure that the static or main magnetic field ($B_0$) is uniform and temporally stable to minimize image distortion. Such a field can be created by a heavy permanent magnet or by a cryogenically cooled super conducting system. In either case, these requirements cause the magnet in an MR system to be very expensive to design, construct, and maintain. Inhomogeneity of the static magnetic field is held to an order of approximately one part in a million.

Whole body magnets are an example of magnets that can generate such a uniform field. Typically, whole body magnets are designed to provide a homogeneous magnetic field in an internal region within the magnet, e.g., in the air space between the magnetic pole plates for a C-type magnet. A patient or object to be imaged is positioned inside the region of the magnet (e.g., the air space) where the field will be homogeneous. The gradient and RF coils used to generate linear gradient pulses and RF pulses, respectively, are typically located proximate the main magnet and/or the patient, for example, within the inner circumference of the main magnet.

Presently, even whole body magnets, which are closed magnet structures, can only produce a homogeneous magnet field suitable for conventional MR imaging or spectroscopy at approximately its center air space region. By the end air space regions of the magnet and outside the magnet ends or edges, the magnetic field is of the type known as fringe fields and is sufficiently inhomogeneous to be unsuitable for conventional MR imaging. Thus, even with the expense of a closed magnet structure, only a limited region of such a magnet is usable without causing image distortions due to field inhomogeneity.

Another disadvantage of closed magnet structures lies in its closed magnet geometry. Typically, closed magnet structures provide limited access to the patient positioned therein for personnel, such as a surgeon, and are thus not suitable, for example, for use in surgical procedures that are guided by real-time MR imaging. The closed geometry also adds to patient discomfort, for example, for patients who may experience claustrophobia.

In contrast, open magnet structures, which are designed to provide access to the patient, overcome some of the problems of closed magnet structures discussed above. Open magnet structures also tend to be cheaper systems to design, construct, and maintain such that they are suitable for environments that do not require all the features associated with closed magnet structures. However, because open magnet structures do not provide one or more magnets, and correspondingly the magnetic fields generated therefrom, that surround or enclose the image volume location from as many sides as possible, the static magnetic fields generated at the image volume locations for open magnet structures are fringe fields that exhibit high field inhomogeneity. Such fringe fields include a much higher field inhomogeneity than those generated for closed magnet structures. Hence, it is very difficult to acquire quality images with such inhomogeneous fringe field using conventional pulse sequences, i.e., pulse sequences typically used in systems with minimal static field inhomogeneity at the image volume, such as, a spin echo pulse sequence.

Thus, there is a need for a pulse sequence configured to use an inhomogeneous static or main magnetic field to produce MR images suitable for clinical MR imaging. There is a further need for a pulse sequence configured to acquire data representative of an image volume in the presence of an inhomogeneous static or main magnetic field relatively quickly (e.g., more than one line of k-space data acquisition per excitation).

BRIEF SUMMARY OF THE INVENTION

One exemplary embodiment relates to a method for magnetic resonance (MR) imaging using an inhomogeneous static magnetic field, the method. The method includes providing the inhomogeneous static magnetic field to an object of interest located within an imaging volume. The inhomogeneous static magnetic field includes a static gradient component oriented in a third direction. The method further includes providing a pulse sequence to the imaging volume. The pulse sequence includes a readout gradient pulse oriented in the third direction, a slice selection gradient pulse oriented in the third direction, a first phase-encoding gradient pulse oriented in a first direction, and a second phase-encoding gradient pulse oriented in a second direction. The method still further includes acquiring a plurality of echo signals emitted from the object of interest located within the imaging volume per excitation of the pulse sequence. The static gradient component comprises the readout gradient pulse and the slice selection gradient pulse.

Another exemplary embodiment relates to a magnetic resonance (MR) system configured to image using an inhomogeneous static magnetic field. The system includes a main magnet having a bore configured to provide the inhomogeneous static magnetic field at an imaging volume located outside the bore. The system further includes a control unit in communication with the main magnet and configured to provide a pulse sequence to acquire a plurality of lines of k-space data per excitation. The pulse sequence includes a readout gradient pulse oriented in a third direction, a slice selection gradient pulse oriented in the third direction, a first phase-encoding gradient pulse oriented in a first direction, and a second phase-encoding gradient pulse oriented in a second direction. The inhomogeneous static magnetic field comprises the readout and the slice selection gradient pulses.

Still another exemplary embodiment relates to a system for magnetic resonance (MR) imaging using an inhomogeneous static magnetic field. The system includes means for providing the inhomogeneous static magnetic field to an object of interest located within an imaging volume. The inhomogeneous static magnetic field includes a static gradient component oriented in a third direction. The system further includes means for providing a pulse sequence to the imaging volume. The pulse sequence includes a readout gradient pulse oriented in the third direction, a slice selection gradient pulse oriented in the third direction, a first phase-encoding gradient pulse oriented in a first direction, and a second phase-encoding gradient pulse oriented in a second direction. The system still further includes means for acquiring a plurality of echo signals emitted from the object of interest located within the imaging volume per excitation of the pulse sequence. The static gradient component comprises the readout gradient pulse and the slice selection gradient pulse.

Still another exemplary embodiment relates to an image generated by the steps of generating an inhomogeneous static magnetic field, the magnetic field including a static gradient component oriented in a third direction, and generating a pulse sequence including a readout gradient pulse oriented in the third direction and a slice selection gradient pulse oriented in the third direction. The image is further generated by the steps of acquiring a plurality of lines of k-space data per excitation of the pulse sequence, and reconstructing the plurality of lines of k-space data to generate the image. The static gradient component comprises the readout gradient pulse and the slice selection gradient pulse.

Yet still another exemplary embodiment relates to a pulse sequence for generating a magnetic resonance (MR) image. The pulse sequence includes a static gradient component of an inhomogeneous static magnetic field, the static gradient component oriented in a z-direction of a Cartesian coordinate system, and a first phase-encoding gradient pulse oriented in a x-direction. The pulse sequence further includes a second phase-encoding gradient pulse oriented in a y-direction, an excitation pulse, and a plurality of refocusing pulses. A plurality of echo signals are acquired per excitation of the pulse sequence.

BRIEF DESCRIPTION OF THE DRAWINGS

The preferred embodiment will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
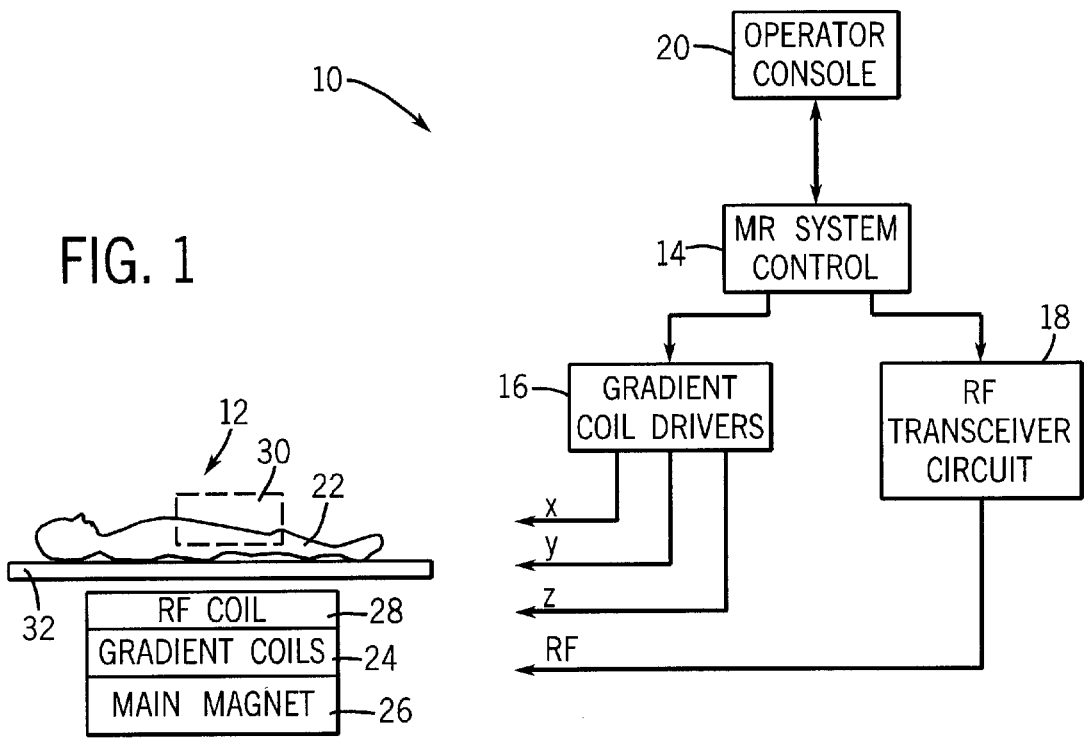
FIG. 1 is a block diagram of a magnetic resonance (MR) imaging system which employs an embodiment of the present invention.

Referring to FIG. 1, there is shown in block diagram of one embodiment of a magnetic resonance (MR) imaging system 10 having an open magnet structure. MR imaging system 10 includes a magnet assembly 12, an MR system control 14, gradient coil drivers 16, a radio frequency (RF) transceiver circuit 18, and an operator console 20. MR system control 14 couples to each of gradient coil drivers 16, RF transceiver circuit 18, and operator console 20. Gradient coil drivers 16 (also referred to as gradient amplifiers) and RF transceiver circuit 18 couples to gradient coils and an RF coil, respectively, included in magnet assembly 12. MR imaging system 10 is configured to permit operators and/or personnel (e.g., physicians and other medical personnel) to access a patient 22 positioned at magnet assembly 12 during a given scan or scanning session.

Magnet assembly 12 is preferably an open magnet structure. Magnet assembly 12 includes gradient coils 24, a main or polarizing magnet 26, and an RF coil 28. In one embodiment, main magnet 26 is a planar magnet as is well-known in the art, and may comprise, among others, a plurality of superconductive coils to provide an image or imaging volume 30 (shown in dashed line in FIG. 1), that is outside the bore of main magnet 26. As shown in FIG. 1, main magnet 26 is configured as an under-the-table magnet structure, i.e., main magnet 26 and coils 24, 28 are positioned under a table or board 32 upon which patient 22 is placed, such that a region of patient 22 to be studied is coincident with the location of imaging volume 30, which is above table 22.

Gradient coils 24 are positioned above main magnet 26, RF coil 28 is positioned above gradient coils 24, table 32 is positioned above RF coil 28, and patient 22 is positioned above table 32. In one embodiment, each of main magnet 26 and coils 24, 28 is approximately 1.0 meter in diameter. RF coil 28 is approximately 3 centimeter (cm) in thickness, gradient coils 24 are approximately 8 cm in thickness, and main magnet 26 is approximately 40 cm in thickness (not shown to scale in FIG. 1). Although not shown, main magnet 26 and coils 24, 28 are nested within one another.

In another embodiment, main magnet 26 and/or coils 24, 28 may be positioned next to or above patient 22. It is also contemplated that main magnet 26 may be a cylindrical or one or more circular shaped magnets (i.e., as conventionally used in closed magnet structures) and imaging volume 30 may be the imaging volume location when imaging in the fringe fields of such cylindrical or circular magnets.

Main magnet 26 generates a main or polarizing magnet field ($B_0$) at the location of imaging volume 30. This main magnetic field is sufficiently non-homogeneous and can be characterized as a fringe field. The main magnetic field can include undesirable gradient components in addition to the desirable static or time constant component due to its high degree of inhomogeneity. As such, the main magnetic field may have a strength of around 0.05 Tesla and include gradient components of around 20 milliTesla per meter (mT/m) within imaging volume 30. Gradient coils 24 generate linear magnetic field gradient pulses that are mutually orthogonal to each other ($g_x$, $g_y$, and $g_z$) to spatially encode MR signals emitted from the region of patient 22 located at imaging volume 30. RF coil 28 generates RF magnetic field pulses to nutate or tip the nuclei comprising the region of patient 22 and to receive the spatially encoded MR signals. The gradient and RF pulses will be described in greater detail hereinafter.

MR system control 14 preferably includes a set of modules connected together by a backplane including an CPU module, a pulse generator module, a memory module, and an array processor module (not shown). MR system control 14 receives commands from an operator (via operator console 20) regarding scan parameters and sequences to be performed. MR system control 14 configures and outputs various signals (including pulse sequence data specifying the timing, length, strength, and shape of the pulses) for the remaining system components to carry out the desired scan sequence. MR system control 14 also receives sensor data and acquired image data from magnet assembly 12 and circuit 18 for processing (such as image data reconstruction), storage, and transmission to the operator.

Gradient coil drivers 16 output signals (e.g., x, y, and z direction signals), to excite corresponding gradient coils 24 included in magnet assembly 12, which in turn generate magnetic field gradient pulses for spatially encoding the MR echo signals. RF transceiver circuit 18 outputs signals to excite RF coil 28 included in magnet assembly 12, thereby emitting RF magnet field pulses and receiving MR echo signals emitted from the region of patient 22 picked up by RF coil 28.

Operator console 20 includes a display coupled to a control panel and an input device coupled to the control panel (not shown). The display of operator console 20 can include, but is not limited to, a liquid crystal display (LED), a light emitting diode (LED) display, a cathode ray tube (CRT) display, a plasma display, a touch screen, a projection display, a printer, a plotter, etc. The input device can include, but is not limited to, a mouse, a joystick, a trackball, a touch screen, a light wand, a voice control device, and a custom keyboard/keypad. The control panel includes dedicated buttons, knobs, switches, slider indicators, LED indicators, actuators, etc. to provide additional interactive functionality. The operator (e.g., a physician, a technician, other medical personnel, etc.) controls and specifies scan session parameters of system 10 in real-time or quasi real-time using operator console 20. For example, operator console 20 is configured to enable the operator to control the production and visualization of MR images in system 10.

Figure 2:
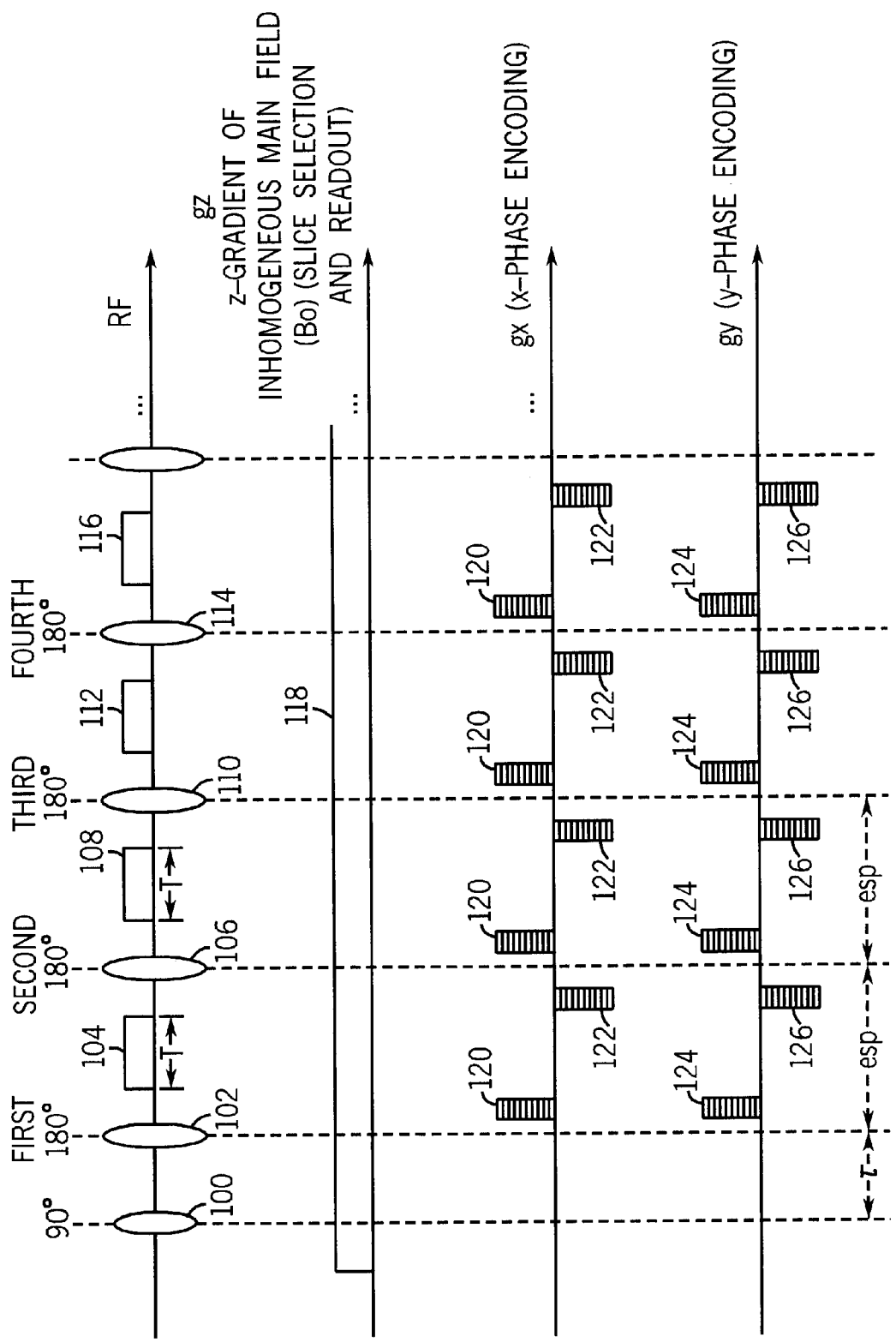
FIG. 2 is a simplified diagram of a pulse sequence used in the MR imaging system of FIG. 1.

Referring to FIG. 2, there is shown a simplified diagram of one embodiment of a three-dimensional (3-D) pulse sequence configured for use in system 10 having a main or magnetic field ($B_0$) at imaging volume 30 that is inhomogeneous and which may be characterized as a fringe field. Such fringe fields include inherent or built-in static gradient components that are too large to compensate by superposition of conventional magnetic field gradient pulses (which are typically of intensity less than 20 mT/m). In one embodiment, the signal to noise level may be enhanced by incorporating a pre-polarizing system. In a pre-polarizing system, a strong polarizing magnetic field pulse, also referred to as a pre-polarizing field (having a duration of approximately $2 \times T_1$, where $T_1$ is a relaxation time constant associated with a given tissue or material), is applied to allow sufficient growth of the magnetization of the nuclei in imaging volume 30, and then the pre-polarizing field is removed, and the MR echo signals are collected in the presence of a weaker main magnetic field.

In any case, the 3-D pulse sequence of FIG. 2 is configured to acquire clinical quality MR images in a relatively short scan time using an inhomogeneous static magnetic field ($B_0$). The pulse sequence of FIG. 2, also referred to as a 3-D multi-echo pulse sequence with constant readout and slice selection gradients, accommodates the built-in static gradient component in the inhomogeneous static magnetic field ($B_0$), namely the built-in static gradient in the z-direction. This 3-D multi-echo pulse sequence has readout and slice selection gradients both oriented in the z-direction. Conventionally, the readout and slice selection gradients are oriented in different directions with respect to each other and/or they are in a pulsed form (rather than being time invariant). In contrast, the 3-D multi-echo pulse sequence obviates and eliminates the need for such pulsed readout and slice selection gradients, and the role of such eliminated gradients are assumed by the built-in static gradient component of the inhomogeneous static magnetic field ($B_0$).

Similar to conventional 3-D fast spin echo (FSE) pulse sequences, the 3-D multi-echo pulse sequence also acquires multiple lines of k-space data with each excitation or pulse train to minimize the scan time. However, unlike conventional 3-D FSE pulse sequences, this pulse sequence utilizes the built-in gradients in the inhomogeneous static magnetic field ($B_0$), such that a separate z-direction gradient pulse from gradient coils 24 is not required. The built-in z-direction gradient in the inhomogeneous static magnetic field ($B_0$) is utilized both for slice selection and for readout. (Hence, system 10 implementing the pulse sequence of FIG. 2 may omit gradient coil drivers 16 for the z-direction and its corresponding gradient coils 24 for the z-direction.)

The 3-D pulse sequence of FIG. 2 is preferably stored in the pulse generator module included in MR system control 14. Data or waveforms representative of the timing, strength, and shape of various pulses comprising the pulse sequence are provided in the pulse generator module of MR system control 14. MR system control 14 selectively communicates with gradient coil drivers 16 and RF transceiver circuit 18 to execute the desired scan sequence, as specified by the pulse sequence.

As shown in FIG. 2, the 3-D pulse sequence using an inhomogeneous static magnetic field ($B_0$) includes a 90° RF pulse 100, a first 180° RF pulse 102, a first data acquisition window 104, a second 180° RF pulse 106, a second data acquisition window 108, a third 180° RF pulse 110, a third data acquisition window 112, a fourth 180° RF pulse 114, a fourth data acquisition window 116, a z-gradient pulse ($g_z$) 118, first x-phase encoding gradient pulses 120, second x-phase encoding gradient pulses 122 (collectively $g_x$), first y-phase encoding gradient pulses 124, and second y-phase encoding gradient pulses 126 (collectively $g_y$).

As a multiple echo pulse sequence for a given excitation (e.g., the 90° RF pulse), each TR (or shot) of the pulse sequence starts with 90° RF pulse 100 (also referred to as an excitation pulse). First 180° RF pulse 102 (also referred to as a first refocusing pulse) follows 90° RF pulse 100 after a time interval τ. First data acquisition window 104 (also referred to as an analog-to-digital converter (ADC) window) follows first 180° RF pulse 102 and is turned on for a time interval T. After first data acquisition window 104 is turned off and after a time interval esp (also referred to as the echo spacing) after first 180° RF pulse 102, second 180° RF pulse 106 is executed. Similarly, each subsequent 180° RF pulse (e.g., third and fourth 180° RF pulses 110, 114) is turned on after a time interval esp from its previous 180° RF pulse. In between each pair of adjacent 180° RF pulses, a data acquisition window (e.g., third and fourth windows 112, 116) is provided for a time period T. Each of windows 104, 108, 112, 116 is timed to pick up an MR echo signal being emitted from the region of patient 22 coincident with imaging volume 30.

These pairs of an 180° RF pulse followed by a data acquisition window (collectively a shot) can repeat a plurality of times after a 90° RF excitation to comprise an echo train. At each data acquisition window, a row of raw k-space data is acquired. For example, an echo train can include 4–200 shots to acquire 4–200 rows of raw k-space data, respectively. Constraining factors to the possible number of shots per echo train include, among others, the echo spacing, $T_2$ decay time, overall scan time desired, and image quality desired (e.g., SNR).

The pulse sequence for a given echo train also includes z-gradient pulse 118. Pulse 118 is a gradient pulse component directed in the z-direction and which is included in the inhomogeneous static magnetic field ($B_0$). Pulse 118 is preferably used for volume selection and readout. Pulse 118 is a constant waveform as a function of time and may have a magnitude in the range of 20 mT/m. Pulse 118 is utilized in place of readout gradient pulses (and its associated pre-phasing pulse) and slice selection gradient pulses, all oriented in the z-direction, that would conventionally be provided by a z-direction gradient coil of gradient coils 2A.

The pulse sequence for a given echo train also includes first and second x-phase encoding gradient pulses 120, 122 and first and second y-phase encoding gradient pulses 124, 126. As shown in FIG. 2, a pair of pulses 120, 122 and a pair of pulses 124, 126 are provided between each pair of 180° RF pulses. Pulses 120, 122, 124, 126 provide spatially encoding to the MR echo signals.

The excitation pulse (e.g., pulse 100) and refocusing pulses (e.g., pulses 102, 106, 110,114) have nominal flip angles of 90° and 180°, respectively. However, in one embodiment, the refocusing pulse flip angle and/or the excitation pulse flip angle may deviate from these nominal values.

To satisfy the Carr-Purcell-Meiboom-Gill (CPMG) condition, the RF, z-gradient, x-phase encoding, and y-phase encoding pulses and the MR echo signals are required to maintain certain phase relationships with respect to each other. The 180° RF pulses 102, 108, 112, 114 all have the same phase angle with respect to a rotating reference frame. The 90° RF pulse 100 (the excitation pulse) has a 90° phase angle with respect to each of the 180° RF pulses 102, 108, 112, 114 (the refocusing pulses).

The integral of gradient pulse 118 for a time interval esp between a given pair of the refocusing pulses (e.g., from the center of first pulse 102 to the center of second pulse 106) is the same or constant as the integral of pulse 118 between any other pair of the refocusing pulses. Similarly, the integral of x-phase encoding gradient pulses 120, 122 for a time interval esp between a given pair of the refocusing pulses is the same between every pair of the refocusing pulses. This constancy in the integral is also applicable for the integral of y-phase encoding gradient pulses 124, 126 for a time interval esp between a given pair of the refocusing pulses. Thus, the gradient integral between each pair of refocusing pulses (for each axis) should be constant.

Moreover, between each pair of the refocusing pulses, the area of first x-phase encoding gradient pulses 120 (also referred to as a pre-phasing gradient in the x-direction) is equal but opposite in sign to the area of second x-phase encoding gradient pulses 122 (also referred to as a rewinding gradient in the x-direction). Similarly, the area of first y-phase encoding gradient pulses 124 (also referred to as a pre-phasing gradient in the y-direction) is equal but opposite in sign to the area of second y-phase encoding gradient pulses 126 (also referred to as a rewinding gradient in the y-direction). Accordingly, the integral of each of $g_x$ and $g_y$ between a given pair of the refocusing pulses is equal to zero.

Between each pair of the refocusing pulses, the pre-phasing and rewinding gradients in the x- and y-directions are turned on after the completion of the first of such a pair of refocusing pulses and are turned off before the start of the second of such a pair of refocusing pulses. For each axis, an effective gradient area between the excitation and the first refocusing pulses (i.e., between the center of pulses 100 and 102) is half that of the gradient area between any given pair of refocusing pulses. In FIG. 2, no x- or y-direction gradient pulses are provided between pulses 100 and 102 so this condition is satisfied. Alternatively, if either of the phase encoding gradients were offset by a constant amount, then additional gradient pulse(s) may be turned on between pulses 100 and 102.

It should be understood that the various pulses shown in FIG. 2 are for illustration purposes only and may not be to exact scale and/or represent the exact shape of the waveforms. This pulse sequence is configured to acquire quality images in the presence of a static magnetic field having an inhomogeneity of approximately 100 times worse than those that may be present in conventional MR systems.

In another embodiment, the pulse sequence of FIG. 2 may be used for two-dimensional (2-D) MR imaging. For 2-D MR imaging, a 3-D series of slices are resolved and then each of the slices is phase corrected (or alternatively, the magnitude image of each of the slices is taken). After phase correction, all of the slices are added together to form the image(s). The pulse sequence for 2-D imaging would also use two sets of phase encoding gradients (in two orthogonal directions), such that the scan time would be the same as for the 3-D imaging.

While the embodiments and application of the invention illustrated in the figures and described above are presently preferred, it should be understood that these embodiments are offered by way of example only. Accordingly, the present invention is not limited to a particular embodiment, but extends to various modifications that nevertheless fall within the scope of the appended claims.

What is claimed is:

1. A method for magnetic resonance (MR) imaging using an inhomogeneous static magnetic field, the method comprising the steps of:

providing the inhomogeneous static magnetic field to an object of interest located within an imaging volume, the inhomogeneous static magnetic field including a static gradient component oriented in a third direction:

providing a pulse sequence to the imaging volume, the pulse sequence including an excitation radio frequency (RF) pulse and n refocusing RF pulses, a readout gradient pulse oriented in the third direction, a slice selection gradient pulse oriented in the third direction, a first phase-encoding gradient pulse oriented in a first direction, and a second phase-encoding gradient pulse oriented in a second direction, wherein the first phase-encoding gradient pulse includes a first pre-phasing gradient pulse followed by a first rewinding gradient pulse, and the second phase-encoding gradient pulse includes a second pre-phasing gradient pulse followed by a second rewinding gradient pulse and wherein an integral of the first pre-phasing gradient pulse is equal and opposite in sign to an integral of the first rewinding gradient pulse within a time period between any adjacent refocusing RF pulses, and an integral of the second pre-phasing gradient pulse is equal and opposite in sign to an integral of the second rewinding gradient pulse within the time period between any adjacent refocusing RF pulses; and acquiring a plurality of echo signals emitted from the object of interest located within the imaging volume per excitation of the pulse sequence, wherein acquiring a plurality of echo signals includes acquiring n lines of k-space data, one line of k-space data for each one of the n refocusing RF pulses;

wherein an integral of the readout gradient pulse between the excitation RF pulse and a first refocusing RF pulse is half the value of an integral of the readout gradient pulse between any two refocusing RF pulses and wherein the static gradient component comprises the readout gradient pulse and the slice selection gradient pulse.

2. The method of claim 1, wherein the first direction, the second direction, and the third direction are mutually orthogonal to each other.

3. The method of claim 1, wherein the first direction is a x-direction, the second direction is a y-direction, and the third direction is a z-direction of a Cartesian coordinate system.

4. The method of claim 1, wherein a difference between a phase angle of the excitation RF pulse and a phase angle of each of the n refocusing RF pulses is 90° degrees.

5. The method of claim 1, wherein providing a pulse sequence includes executing the first and the second phase-encoding gradient pulses after an ith refocusing RF pulse and before an (i+1)th refocusing RF pulse, where i=1 to n.

6. The method of claim 1, wherein the imaging volume is located outside a magnet configured to generate the inhomogeneous static magnetic field.

7. The method of claim 1, wherein the readout gradient pulse and the slice selection gradient pulse are time invariant and a magnitude of the combined readout and slice selection gradient pulses is approximately 20 mT/m.

8. The method of claim 7, wherein the pulse sequence includes a time variant gradient pulse oriented in the third direction.

9. The method of claim 1, further comprising:
resolving a three-dimensional series of slices corresponding to the plurality of echo signals acquired;
phase correcting each of the slices; and
combining the slices, thereby performing two-dimensional MR imaging.

10. A pulse sequence for generating a magnetic resonance (MR) image, the pulse sequence comprising:

a static gradient component of an inhomogeneous static magnetic field, the static gradient component oriented in a z-direction of a Cartesian coordinate system;

a first phase-encoding gradient pulse oriented in a x-direction;

a second phase-encoding gradient pulse oriented in a y-direction;

a readout gradient pulse and a slice selection gradient pulse oriented in the z-direction, wherein the static gradient component of the inhomogeneous static magnetic field is the readout and the slice selection gradient pulses;

an excitation pulse, aid a plurality of refocusing pulses, where n a plurality of echo signals are acquired per excitation of the pulse sequence;

wherein an integral of the readout gradient pulse between the excitation pulse and a first refocusing pulse is half the value of an integral of the readout gradient pulse between any two refocusing pulses.

11. The pulse sequence of claim 10, wherein a number of echo signals acquired per excitation is equal to a number of the refocusing pulses.

12. The pulse sequence of claim 11, wherein the number of the refocusing pulses per excitation is in the range of 4 to 200.

13. The pulse sequence of claim 10, wherein the MR image is a three-dimensional MR image.

14. The pulse sequence of claim 10, wherein an imaging volume associated with the MR image is located outside a magnet configured to generate the inhomogeneous static magnetic field.

15. The pulse sequence of claim 10, wherein a difference between a phase angle of the excitation pulse and a phase angle of each of the refocusing pulses is 90 degrees, and each of the excitation pulse and the refocusing pulses is a radio frequency (RF) pulse.

16. The pulse sequence of claim 10, wherein the first and the second phase-encoding gradient pulses are executed after an ith refocusing pulse and before an (i+1)th of the refocusing pulses.

17. The pulse sequence of claim 10, wherein each of the first and the second phase-encoding gradient pulses includes a pre-phasing gradient pulse followed by a rewinding gradient pulse.

18. The pulse sequence of claim 17, wherein an integral of the pre-phasing gradient pulse is equal and opposite in sign to an integral of the rewinding gradient pulse within a time period between any adjacent refocusing pulses.

19. The pulse sequence of claim 10, wherein the static gradient component is time invariant.

* * * * *

UNITED STATES PATENT AND TRADEMARK OFFICE
CERTIFICATE OF CORRECTION

PATENT NO.   : 6,570,383 B1  
DATED        : May 27, 2003  
INVENTOR(S)  : Graeme C. McKinnon and Jean H. Brittain Page 1 of 1

It is certified that error appears in the above-identified patent and that said Letters Patent is hereby corrected as shown below:

<u>Column 10,</u>
Line 14, delete "aid" and replace with -- and --.
Line 15, delete "where n" and replace with -- wherein --.

Signed and Sealed this

Twelfth Day of August, 2003

JAMES E. ROGAN
*Director of the United States Patent and Trademark Office*